(12) United States Patent
Yeh

(10) Patent No.: US 10,656,178 B2
(45) Date of Patent: May 19, 2020

(54) METHOD FOR ALIGNING INHOMOGENEOUS RECEIVER WITH ANISOTROPIC EMITTER ON WAFER PROBING SYSTEM

(71) Applicant: WIN Semiconductor Corp., Tao Yuan (TW)

(72) Inventor: Shu-Jeng Yeh, Tao Yuan (TW)

(73) Assignee: Win Semiconductors Corp., Guishan District, Tao Yuan (TW)

( * ) Notice: Subject to any disclaimer, the term of this patent is extended or adjusted under 35 U.S.C. 154(b) by 182 days.

(21) Appl. No.: 15/975,566

(22) Filed: May 9, 2018

(65) Prior Publication Data

US 2019/0178912 A1 Jun. 13, 2019

(30) Foreign Application Priority Data

Dec. 12, 2017 (TW) .............................. 106143594 A

(51) Int. Cl.
| | | |
|---|---|---|
| *G01R 31/02* | (2006.01) | |
| *G01R 1/073* | (2006.01) | |
| *G01R 31/28* | (2006.01) | |
| *G01R 31/26* | (2020.01) | |
| *G01R 1/067* | (2006.01) | |

(52) U.S. Cl.
CPC ..... *G01R 1/07307* (2013.01); *G01R 1/06794* (2013.01); *G01R 31/2601* (2013.01); *G01R 31/2891* (2013.01)

(58) Field of Classification Search
CPC ............ G01R 1/07307; G01R 1/07314; G01R 1/07342; G01R 1/07364; G01R 1/0735; G01R 1/07378; G01R 1/06794; G01R 1/06711; G01R 1/06738; G01R 1/06772; G01R 31/2601; G01R 31/2635; G01R 31/2831; G01R 31/2891; G01R 31/2886; G01R 31/2889
See application file for complete search history.

(56) References Cited

U.S. PATENT DOCUMENTS

| | | | | |
|---|---|---|---|---|
| 5,399,983 A | * | 3/1995 | Nagasawa .......... | G01R 1/06794 324/750.19 |
| 7,397,257 B2 | * | 7/2008 | Kobayashi ......... | G01R 31/2891 324/750.23 |

(Continued)

*Primary Examiner* — Thang X Le
(74) *Attorney, Agent, or Firm* — Muncy, Geissler, Olds & Lowe, P.C.

(57) ABSTRACT

A method for aligning an inhomogeneous receiver with an anisotropic emitter on a wafer probing system, wherein a reference semiconductor die comprising a reference pad and an anisotropic emitter is formed on a semiconductor wafer, the reference pad is located at a reference-pad-and-anisotropic-emitter relative position corresponding to the anisotropic emitter, the method comprises following steps of: measuring a receiver center position of an inhomogeneous receiver configured on a wafer probing system by a profile sensor; measuring a reference tip position of a reference tip of a reference probe on a probe card by a measuring instrument; displacing the inhomogeneous receiver in an aligning displacement according to the reference-pad-and-anisotropic-emitter relative position, the reference tip position and the receiver center position; and aligning the reference tip with the reference pad by a probe-tip-and-pad aligning machine of the wafer probing system.

25 Claims, 15 Drawing Sheets

(56) References Cited

U.S. PATENT DOCUMENTS

| | | | |
|---|---|---|---|
| 2005/0099196 A1* | 5/2005 | Sasaki | G01R 31/2891 324/750.22 |
| 2007/0296427 A1* | 12/2007 | Kono | G01R 31/2891 324/750.19 |
| 2009/0251163 A1* | 10/2009 | Yamada | G01R 31/2891 324/754.01 |
| 2017/0219625 A1* | 8/2017 | Saiki | G01R 1/06794 |
| 2019/0025342 A1* | 1/2019 | Mori | G01R 31/2891 |

* cited by examiner

METHOD FOR ALIGNING INHOMOGENEOUS RECEIVER WITH ANISOTROPIC EMITTER ON WAFER PROBING SYSTEM

FIELD OF THE INVENTION

The present invention relates to a method for aligning an inhomogeneous receiver with an anisotropic emitter on a wafer probing system by applying a profile sensor to measure a receiver center position of an inhomogeneous receiver.

BACKGROUND OF THE INVENTION

Please refer to FIG. 8, which is a sectional schematic view of an implementation step of an embodiment of a method for aligning receiver with emitter on wafer probing system of conventional technology. A wafer probing system 9 comprises a receiver 902, a plurality of system positioning portions 909 and a probe-tip-and-pad aligning machine 900. The receiver 902 comprises a receiver input 903, wherein the receiver 902 is an integrating sphere. A semiconductor wafer 905 is loaded on the probe-tip-and-pad aligning machine 900. A plurality of semiconductor dies 906 are formed on the semiconductor wafer 905. Each of the plurality of semiconductor dies 906 comprises a plurality of pads 908 and an emitter 907, wherein the emitter 907 is a laser diode. A probe card 901 comprises a plurality of probe-card positioning portions 912, a through hole 911 and a plurality of probes 904. Please also refer to FIG. 9, which is a top schematic view of an integrating sphere searching trajectory of an embodiment of a method for aligning receiver with emitter on wafer probing system of conventional technology. The method for aligning receiver 902 with emitter 907 on wafer probing system 9 of conventional technology comprises following steps of: connecting the plurality of probe-card positioning portions 912 of the probe card 901 to the plurality of system positioning portions 909 of the wafer probing system 9 such that the probe card 901 is connected to the wafer probing system 9; aligning the probes 904 with the pads 908 by the probe-tip-and-pad aligning machine 900 of the wafer probing system 9; electrically contacting the probes 904 to the pads 908 and outputting a control signal by the probes 904 such that the emitter 907 continuously emits an electromagnetic wave; slowly moving the receiver 902 along a searching trajectory 910 and simultaneously recording a power signal received by the receiver 902; according to the power signal and the searching trajectory 910, calculating an optimal alignment point of a receiver center of the receiver input 903 of the receiver 902 with an emitter center of the emitter 907; and displacing the receiver 902 to the optimal alignment point of the receiver center of the receiver input 903 of the receiver 902 with the emitter center of the emitter 907.

In conventional technology, it wastes too much time on aligning the receiver center of the receiver input 903 of the receiver 902 with the emitter center of the emitter 907. Furthermore, in conventional technology, the real receiver center couldn't be find out through searching the optimal alignment point of the receiver center of the receiver input 903 of the receiver 902 with the emitter center of the emitter 907. Hence, after alignment procedure, it is difficult to figure out how much the difference between the real receiver center and the optimal one is. Therefore, after displacing the receiver 902 to the optimal alignment point of the receiver center of the receiver input 903 of the receiver 902 with the emitter center of the emitter 907, it is difficult to figure out how many semiconductor dies 906 are covered by a measuring range of the receiver 902. Moreover, each time the probe card 901 is replaced by a new probe card, it is needed to search again the optimal alignment point of the receiver center of the receiver input 903 of the receiver 902 with the emitter center of the emitter 907.

Accordingly, the present invention has developed a new design which may avoid the above mentioned drawbacks, may significantly enhance the performance of the devices and may take into account economic considerations. Therefore, the present invention then has been invented.

SUMMARY OF THE INVENTION

The main technical problem that the present invention seeking to solve is: how to align the receiver center of the receiver input of the receiver with the emitter center of the emitter efficiently and precisely in order to achieve precisely alignment of the receiver with the emitter; and accurately calculated how many semiconductor dies are covered by a measuring range of the receiver after the alignment of the receiver with the emitter; thereby the number of alignment procedure by the probe-tip-and-pad aligning machine is reduced, in the meanwhile, it can be achieved to test multiple semiconductor dies at the same time, especially in the application to microwave emitter and receiver, and optical emitter and receiver.

In order to solve the problems mentioned the above and to achieve the expected effect, the present invention provides a method for aligning an inhomogeneous receiver with an anisotropic emitter on a wafer probing system, the method comprises following steps of: Step A: measuring a receiver center position of an inhomogeneous receiver by a profile sensor, wherein the inhomogeneous receiver is configured on a wafer probing system; Step B: measuring a reference tip position of a reference tip of a reference probe on a probe card by a measuring instrument; Step C: displacing the inhomogeneous receiver in an aligning displacement according to a reference-pad-and-anisotropic-emitter relative position, the reference tip position and the receiver center position, wherein a reference semiconductor die is formed on a semiconductor wafer, wherein the reference semiconductor die comprises a reference pad and an anisotropic emitter, wherein the reference pad is located at a reference-pad-and-anisotropic-emitter relative position corresponding to the anisotropic emitter; and Step D: aligning the reference tip of the reference probe with the reference pad by a probe-tip-and-pad aligning machine of the wafer probing system; thereby the precise alignment of the inhomogeneous receiver with the anisotropic emitter is achieved.

In an embodiment, the Step A comprises following steps of: Step A10: sensing a first contour of the inhomogeneous receiver along a first sensing direction by the profile sensor; Step A20: sensing a second contour of the inhomogeneous receiver along a second sensing direction by the profile sensor, wherein the second sensing direction is at an angle to the first sensing direction, wherein the angle is greater than 0 degree and less than 180 degrees; and Step A30: calculating the receiver center position of the inhomogeneous receiver by the first contour of the inhomogeneous receiver and the second contour of the inhomogeneous receiver.

In an embodiment, the angle is equal to 90 degrees.

In an embodiment, the profile sensor is configured on a sensor board, wherein the sensor board has at least one sensor-board positioning portion, wherein the wafer probing system has at least one first system positioning portion, wherein the at least one sensor-board positioning portion is capable of being connected to the at least one first system positioning portion.

In an embodiment, the Step A comprises following steps of: Step A10: configuring the profile sensor on the sensor board such that the profile sensor senses a first contour of the inhomogeneous receiver along a first sensing direction; Step A20: configuring the profile sensor on the sensor board such that the profile sensor senses a second contour of the inhomogeneous receiver along a second sensing direction, wherein the second sensing direction is at an angle to the first sensing direction, wherein the angle is greater than 0 degree and less than 180 degrees; and Step A30: calculating the receiver center position of the inhomogeneous receiver by the first contour of the inhomogeneous receiver and the second contour of the inhomogeneous receiver.

In an embodiment, the angle is equal to 90 degrees.

In an embodiment, the probe card has at least one first probe-card positioning portion, wherein the at least one first probe-card positioning portion is capable of being connected to the at least one first system positioning portion.

In an embodiment, the measuring instrument has at least one measuring-instrument positioning portion, wherein the at least one first probe-card positioning portion is capable of being connected to the at least one measuring-instrument positioning portion.

In an embodiment, the probe card has at least one second probe-card positioning portion, wherein the measuring instrument has at least one measuring-instrument positioning portion, wherein the at least one second probe-card positioning portion is capable of being connected to the at least one measuring-instrument positioning portion.

In an embodiment, the wafer probing system has at least one second system positioning portion, wherein the probe card has at least one first probe-card positioning portion, wherein the at least one first probe-card positioning portion is capable of being connected to the at least one second system positioning portion.

In an embodiment, the measuring instrument has at least one measuring-instrument positioning portion, wherein the at least one first probe-card positioning portion is capable of being connected to the at least one measuring-instrument positioning portion.

In an embodiment, the probe card has at least one second probe-card positioning portion, wherein the measuring instrument has at least one measuring-instrument positioning portion, wherein the at least one second probe-card positioning portion is capable of being connected to the at least one measuring-instrument positioning portion.

In an embodiment, the measuring instrument is configured on the wafer probing system.

In an embodiment, the steps of the method are in one of following sequences of: (1) the Step A, the Step B, the Step C and the Step D; (2) the Step B, the Step A, the Step C and the Step D; (3) the Step A, the Step B, the Step D and the Step C; and (4) the Step B, the Step A, the Step D and the Step C.

In an embodiment, in the Step B, the reference tip of the reference probe is upwards.

In an embodiment, in the Step D, the reference tip of the reference probe is downwards.

In an embodiment, the measuring instrument is selected from the group consisting of: a microscope and a ruler.

In an embodiment, the profile sensor is a two dimensional laser profile sensor.

In an embodiment, the inhomogeneous receiver is selected from the group consisting of: a photosensitive device and a light collection device.

In an embodiment, the photosensitive device is selected from the group consisting of: a charge coupled device and a complementary metal-oxide-semiconductor device.

In an embodiment, the anisotropic emitter is selected from the group consisting of: a light emitting diode and a laser diode.

In an embodiment, the inhomogeneous receiver is selected from the group consisting of: an integrating sphere, an optical filter, a lens, a horn antenna and an electromagnetic waveguide.

In an embodiment, the anisotropic emitter is selected from the group consisting of: a patch antenna and a slot antenna.

In an embodiment, the reference semiconductor die and a plurality of adjacent semiconductor dies are formed on the semiconductor wafer within a testing area, wherein the reference pad is located at a reference pad testing position within the testing area; wherein in the Step C, the inhomogeneous receiver is displaced in the aligning displacement according to the reference pad testing position, the reference tip position and the receiver center position such that a measuring range of the inhomogeneous receiver covers the anisotropic emitter of the reference semiconductor die and an adjacent anisotropic emitter of each of the plurality of adjacent semiconductor dies within the testing area after the Step A, the Step B, the Step C and the Step D of the method are executed, thereby the wafer probing testing time is significantly reduced.

In an embodiment, the anisotropic emitter of the reference semiconductor die and an adjacent anisotropic emitter of each of the plurality of adjacent semiconductor dies within the testing area are capable of being tested at the same time.

For further understanding the characteristics and effects of the present invention, some preferred embodiments referred to drawings are in detail described as follows.

DETAILED DESCRIPTION OF PREFERRED EMBODIMENTS

A method for aligning an inhomogeneous receiver with an anisotropic emitter on a wafer probing system of the present invention comprises following steps of: Step A: measuring a receiver center position of an inhomogeneous receiver by a profile sensor, wherein the inhomogeneous receiver is configured on a wafer probing system; Step B: measuring a reference tip position of a reference tip of a reference probe on a probe card by a measuring instrument; Step C: displacing the inhomogeneous receiver in an aligning displacement according to a reference-pad-and-anisotropic-emitter relative position, the reference tip position and the receiver center position, wherein a reference semiconductor die is formed on a semiconductor wafer, wherein the reference semiconductor die comprises a reference pad and an anisotropic emitter, wherein the reference pad is located at a reference-pad-and-anisotropic-emitter relative position corresponding to the anisotropic emitter; and Step D: aligning the reference tip of the reference probe with the reference pad by a probe-tip-and-pad aligning machine of the wafer probing system; thereby the precise alignment of the inhomogeneous receiver with the anisotropic emitter is achieved.

Figure 1A:
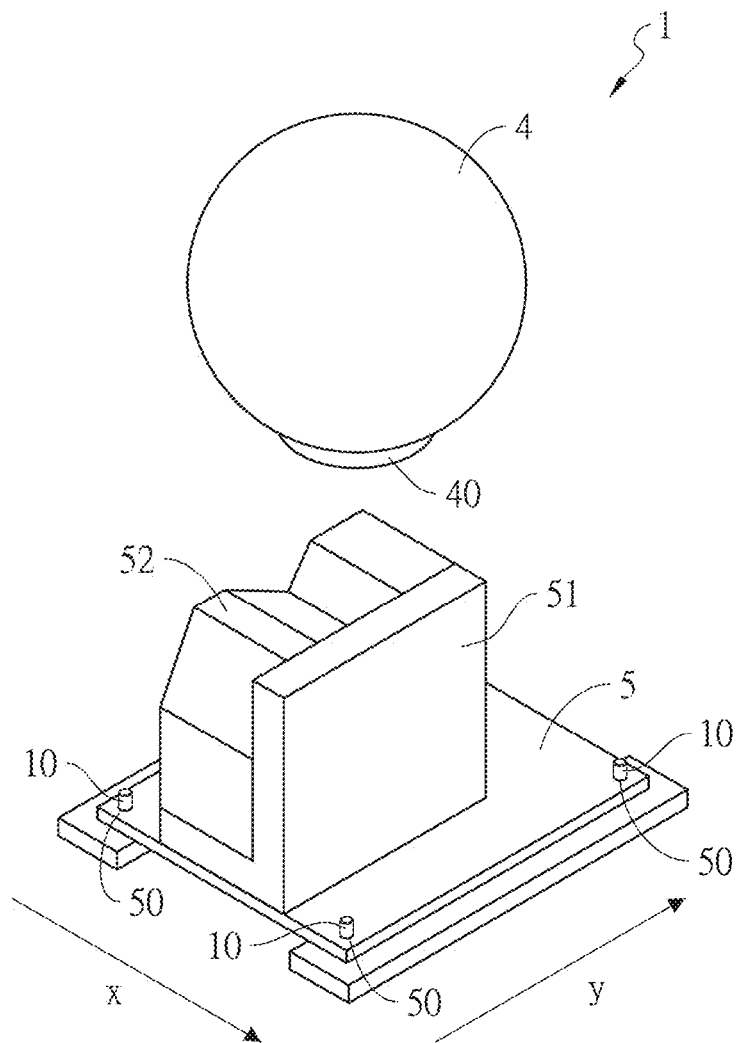
FIG. 1A is a perspective schematic view of an implementation step of an embodiment of a method for aligning an inhomogeneous receiver with an anisotropic emitter on a wafer probing system of the present invention.
Figure 1B:
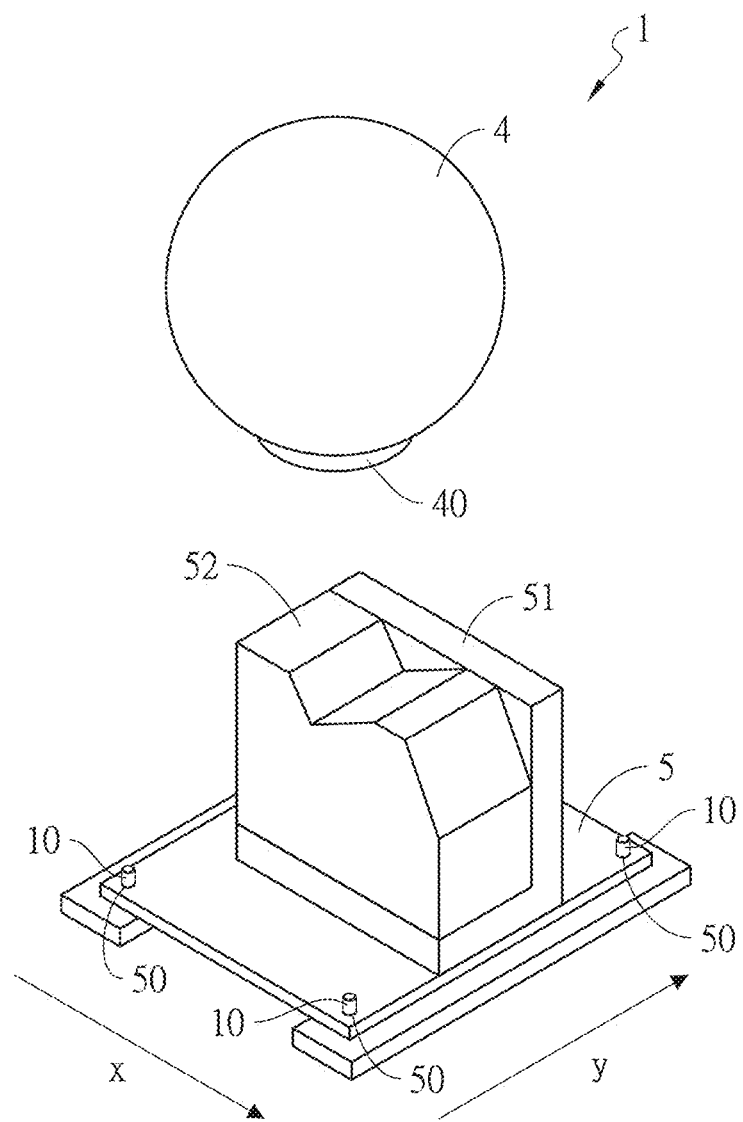
FIG. 1B is a perspective schematic view of another implementation step of an embodiment of a method for aligning an inhomogeneous receiver with an anisotropic emitter on a wafer probing system of the present invention.

Please refer to FIG. 1A, which is a perspective schematic view of an implementation step of an embodiment of a method for aligning an inhomogeneous receiver with an anisotropic emitter on a wafer probing system of the present invention. Please also refer to FIG. 1B, which is a perspective schematic view of another implementation step of an embodiment of a method for aligning an inhomogeneous receiver with an anisotropic emitter on a wafer probing system of the present invention. FIGS. 1A and 1B present an embodiment of Step A. A wafer probing system 1 comprises a plurality of first system positioning portions 10, wherein an inhomogeneous receiver 4 is configured on the wafer probing system 1. The inhomogeneous receiver 4 comprises a receiver input 40. A sensor board 5 comprises a plurality of sensor-board positioning portions 50, wherein the location of the plurality of sensor-board positioning portions 50 on the sensor board 5 are determined during manufacturing the sensor board 5. The sensor board 5 is connected to the wafer probing system 1 by connecting the plurality of sensor-board positioning portions 50 to the plurality of first system positioning portions 10 of the wafer probing system 1. Step A: measuring a receiver center position of the inhomogeneous receiver 4 by a profile sensor 52, wherein the Step A comprises following steps of: Step A10: sensing a first contour of the inhomogeneous receiver 4 along a first sensing direction (as shown in FIG. 1A) by the profile sensor 52, wherein in the embodiment of FIG. 1A, the profile sensor 52 is configured to the sensor board 5 by an adapter board 51 such that the profile sensor 52 may sense the first contour of the inhomogeneous receiver 4 along the first sensing direction; Step A20: sensing a second contour of the inhomogeneous receiver 4 along a second sensing direction (as shown in FIG. 1B) by the profile sensor 52, wherein the second sensing direction is at an angle to the first sensing direction, wherein the angle is equal to 90 degrees, wherein in the embodiment of FIG. 1B, the profile sensor 52 is configured to the sensor board 5 by the adapter board 51 such that the profile sensor 52 may sense the second contour of the inhomogeneous receiver 4 along the second sensing direction; wherein the relative positions between the sensor board 5, the first contour of the inhomogeneous receiver 4 and the second contour of the inhomogeneous receiver 4 sensed by the profile sensor 52 are determined during manufacturing the profile sensor 52, the sensor board 5 and the adapter board 51; and Step A30: calculating the receiver center position of the inhomogeneous receiver 4 by the first contour of the inhomogeneous receiver 4 and the second contour of the inhomogeneous receiver 4. Since the plurality of sensor-board positioning portions 50 of the sensor board 5 is connected to the plurality of first system positioning portions 10 of the wafer probing system 1 when the profile sensor 52 is sensing, the receiver center position of the inhomogeneous receiver 4 corresponding to the sensor board 5 can be calculated, and also the receiver center position of the inhomogeneous receiver 4 corresponding to the wafer probing system 1 can be calculated. Before the Step A10, the Step A may further comprises following step of: Step A1: connecting the plurality of sensor-board positioning portions 50 of the sensor board 5 to the plurality of first system positioning portions 10 of the wafer probing system 1 such that the sensor board 5 is connected to the wafer probing system 1. After the Step A30, the Step A may further comprises following step of: Step A40: separating the connection of the plurality of sensor-board positioning portions 50 of the sensor board 5 and the plurality of first system positioning portions 10 of the wafer probing system 1, and moving away the sensor board 5. In the embodiments of FIGS. 1A and 1B, the profile sensor 52 is a two dimensional laser profile sensor. In some embodiments, the angle between the second sensing direction and the first sensing direction is greater than 0 degree and less than 180 degrees. In some other embodiments, the angle between the second sensing direction and the first sensing direction is greater than 45 degrees and less than 135 degrees. In some other embodiments, the angle between the second sensing direction and the first sensing direction is greater than 60 degrees and less than 120 degrees. In some embodiments, the inhomogeneous receiver 4 is selected from the group consisting of: an integrating sphere, an optical filter, a lens, a horn antenna and an electromagnetic waveguide. In some other embodiments, the inhomogeneous receiver 4 is selected from the group consisting of: a photosensitive device and a light collection device, wherein the photosensitive device is selected from the group consisting of: a charge coupled device (CCD) and a complementary metal-oxide-semiconductor device (CMOS).

Figure 1C:
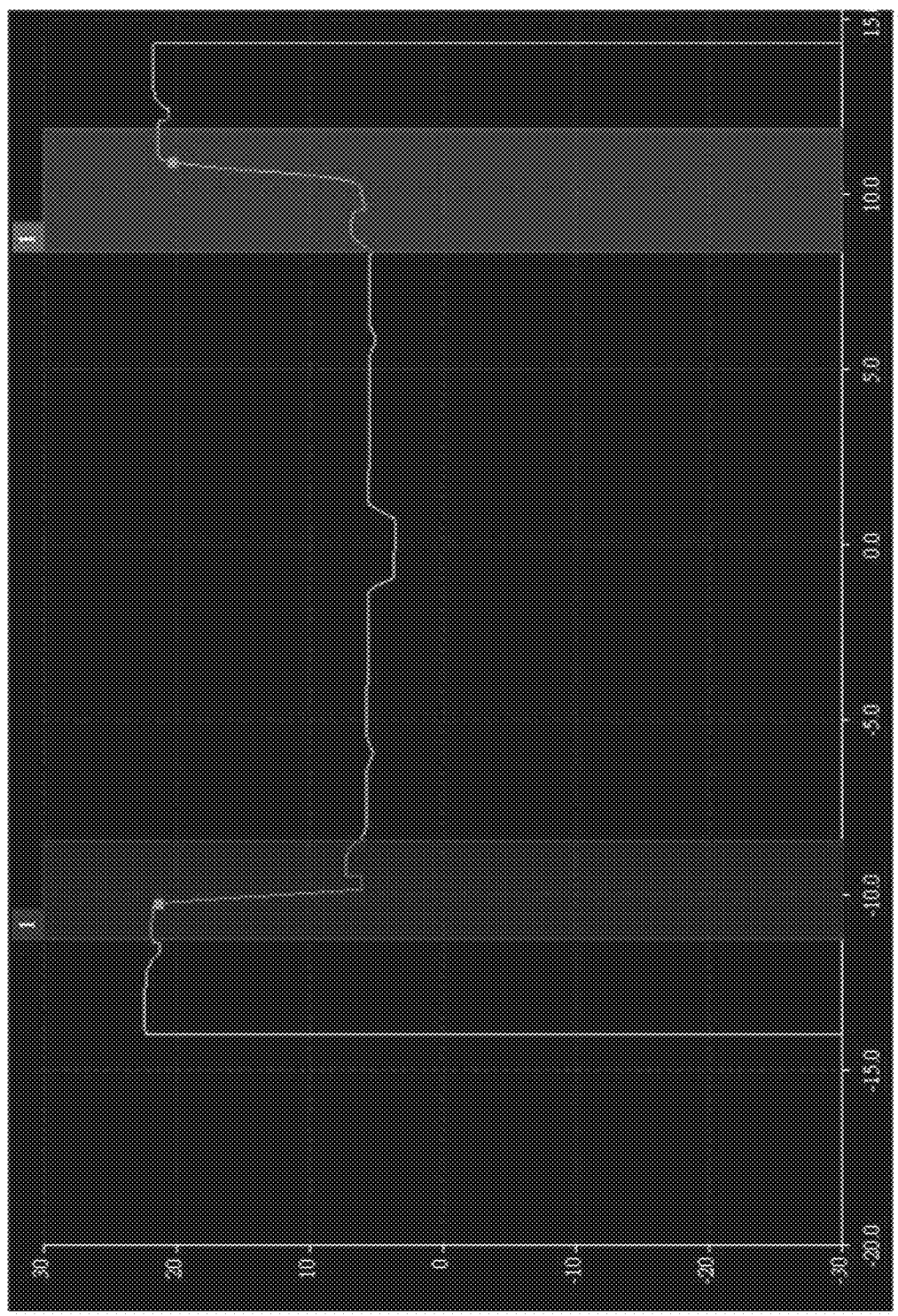
FIG. 1C is a contour graph of an inhomogeneous receiver sensed by a profile sensor of an embodiment of a method for aligning an inhomogeneous receiver with an anisotropic emitter on a wafer probing system of the present invention.

Please refer to FIG. 1C, which is a contour graph of an inhomogeneous receiver sensed by a profile sensor of an embodiment of a method for aligning an inhomogeneous receiver with an anisotropic emitter on a wafer probing system of the present invention. The inhomogeneous receiver 4 is an integrating sphere. The contour graph of the inhomogeneous receiver 4 is the first contour of the inhomogeneous receiver 4 sensed by the profile sensor 52 along the first sensing direction (as shown in FIG. 1A). The range of the inhomogeneous receiver 4 is located between −10 and 10 of the horizontal axis in the graph, wherein the receiver input 40 of the inhomogeneous receiver 4 is located between about −1.5 and 1.5 of the horizontal axis in the graph. Then sensing the second contour of the inhomogeneous receiver 4 along the second sensing direction (as shown in FIG. 1B) by the profile sensor 52, wherein the second sensing direction is at an angle to the first sensing direction, wherein the angle is equal to 90 degrees. And then the receiver center position of the inhomogeneous receiver 4 can be calculated by the first contour of the inhomogeneous receiver 4 and the second contour of the inhomogeneous receiver 4.

Figure 2A:
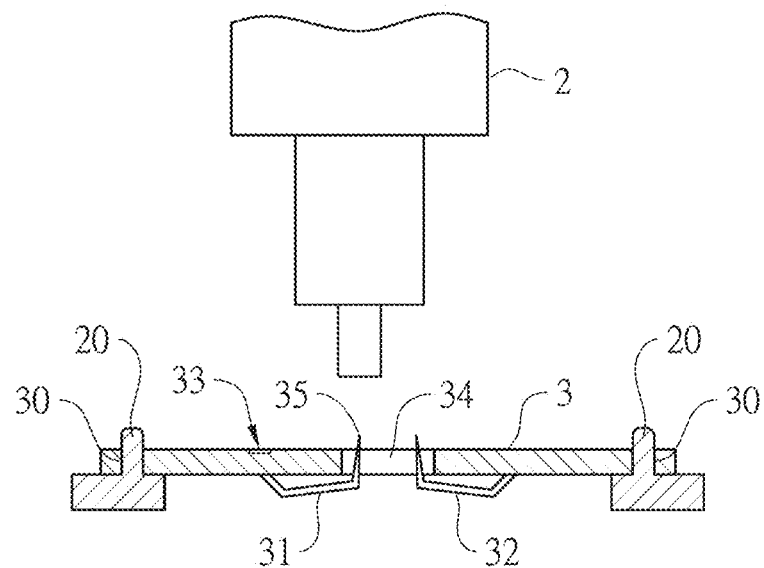
FIG. 2A is a sectional schematic view of an implementation step of an embodiment of a method for aligning an inhomogeneous receiver with an anisotropic emitter on a wafer probing system of the present invention.

Please refer to FIG. 2A, which is a sectional schematic view of an implementation step of an embodiment of a method for aligning an inhomogeneous receiver with an anisotropic emitter on a wafer probing system of the present invention. Please also refer to FIG. 2B, which is a top schematic view of a probe card (tips of the probes are upwards) of an embodiment of a method for aligning an inhomogeneous receiver with an anisotropic emitter on a wafer probing system of the present invention. FIG. 2A presents an embodiment of Step B. A probe card 3 comprises a plurality of first probe-card positioning portions 30, a plurality of probes 32, a reference probe 31, a through hole 34 and a probe card reference point 33. The reference probe 31 has a reference tip 35. The relative positions between a tip of each of the plurality of probes 32 and the reference tip 35 of the reference probe 31 are corresponding to the distribution of pads of the semiconductor die under test (please refer to the embodiment of FIG. 3B later) and fixed by adhesion. The relative positions between the plurality of first probe-card positioning portions 30 and the probe card reference point 33 of the probe card 3 are determined during manufacturing the probe card 3. However, the positions of the tip of each of the plurality of probes 32 and the reference tip 35 of the reference probe 31 on the probe card 3 needs to be measured by a measuring instrument 2 after the plurality of probes 32 and the reference probe 31 are fixed on the probe card 3 by adhesion. The measuring instrument 2 comprises a plurality of measuring-instrument positioning portions 20. The probe card 3 is connected to the measuring instrument 2 by connecting the plurality of first probe-card positioning portions 30 to the plurality of measuring-instrument positioning portions 20 of the measuring instrument 2, and such that a tip of each of the plurality of probes 32 and the reference tip 35 of the reference probe 31 are upwards. In the Step B, a reference tip position (the position on the probe card 3) of the reference tip 35 of the reference probe 31 on the probe card 3 is measured by the measuring instrument 2. By measuring the relative position between the reference tip 35 of the reference probe 31 of the probe card 3 and the probe card reference point 33 of the probe card 3, the reference tip position of the reference tip 35 of the reference probe 31 on the probe card 3 can be calculated. Before executing measuring the reference tip position of the reference tip 35 of the reference probe 31 on the probe card 3, the Step B may further comprises following step of: connecting the plurality of first probe-card positioning portions 30 of the probe card 3 to the plurality of measuring-instrument positioning portions 20 of the measuring instrument 2 such that the probe card 3 is connected to the measuring instrument 2. After executing measuring the reference tip position of the reference tip 35 of the reference probe 31 on the probe card 3, the Step B may further comprises following step of: separating the connection of the plurality of first probe-card positioning portions 30 of the probe card 3 and the plurality of measuring-instrument positioning portions 20 of the measuring instrument 2, and moving away the probe card 3. In current embodiment, the measuring instrument 2 is selected from the group consisting of: a microscope and a ruler. In some embodiments, there is no such a probe card reference point 33 on the probe card 3; wherein in the Step B, the reference tip position of the reference tip 35 of the reference probe 31 on the probe card 3 can be calculated by measuring the relative position between the reference tip 35 of the reference probe 31 on the probe card 3 and any one of the plurality of first probe-card positioning portions 30 of the probe card 3. In some other embodiments, there is no such a probe card reference point 33 on the probe card 3; wherein in the Step B, the reference tip position of the reference tip 35 of the reference probe 31 on the probe card 3 can be calculated by measuring the relative position between the reference tip 35 of the reference probe 31 on the probe card 3 and any one of the plurality of measuring-instrument positioning portions 20 of the measuring instrument 2.

In some embodiments, the steps of the method for aligning an inhomogeneous receiver with an anisotropic emitter on a wafer probing system of the present invention are in following sequences of: the Step A and the Step B. In some other embodiments, the steps of the method for aligning an inhomogeneous receiver with an anisotropic emitter on a wafer probing system of the present invention are in following sequences of: the Step B and the Step A.

In the method for aligning an inhomogeneous receiver with an anisotropic emitter on a wafer probing system of the present invention, the receiver center position of the inhomogeneous receiver 4 on the wafer probing system 1 is measured by the Step A. In wafer probe testing, the same inhomogeneous receiver 4 may be used for different probe card 3. In the method for aligning an inhomogeneous receiver with an anisotropic emitter on a wafer probing system of the present invention, even changing a different probe card 3 (the same inhomogeneous receiver 4), it is no need to execute the Step A again to measure the receiver center position of the inhomogeneous receiver 4 on the wafer probing system 1. However it is needed to execute the Step B again to measure the reference tip position of the reference tip 35 of the reference probe 31 for different probe card 3.

Figure 2B:
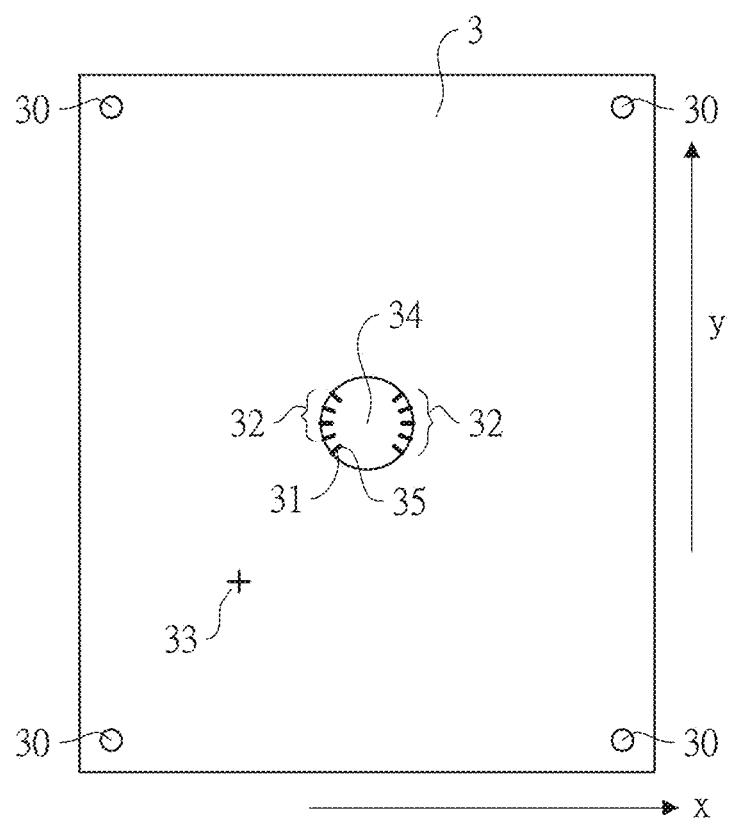
FIG. 2B is a top schematic view of a probe card (tips of the probes are upwards) of an embodiment of a method for aligning an inhomogeneous receiver with an anisotropic emitter on a wafer probing system of the present invention.
Figure 3A:
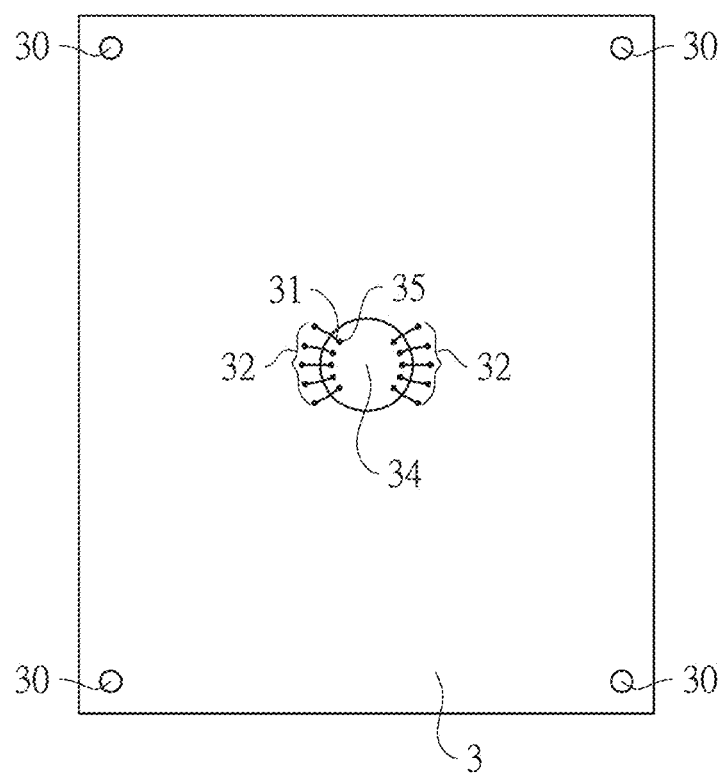
FIG. 3A is a schematic view of the probe card of FIG. 2B rotated along the X axis (tips of the probes are downwards).
Figure 3B:
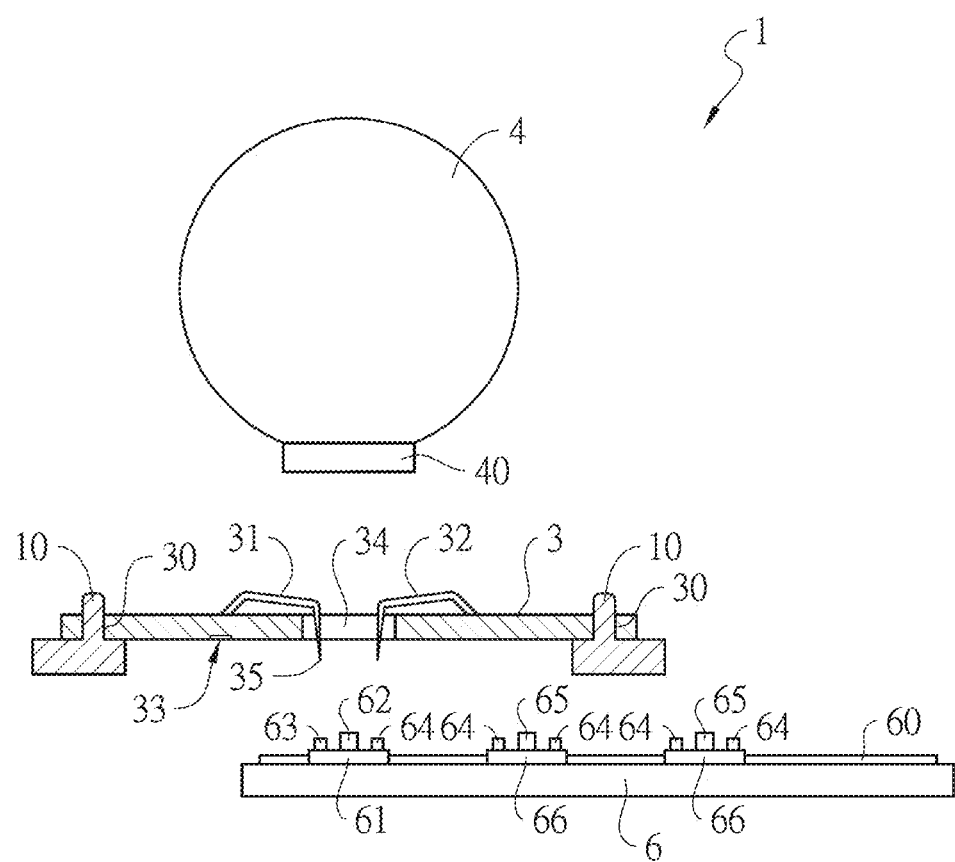
FIG. 3B is a sectional schematic view of an implementation step of an embodiment of a method for aligning an inhomogeneous receiver with an anisotropic emitter on a wafer probing system of the present invention.

Please refer to FIG. 3A, which is a schematic view of the probe card of FIG. 2B rotated along the X axis (tips of the probes are downwards). In current embodiment, when the probe card 3 has been rotated (180 degree) along the X axis such that the tip of each of the plurality of probes 32 and the reference tip 35 of the reference probe 31 are downwards, the plurality of first probe-card positioning portions 30 of the probe card 3 may be connected to the plurality of first system positioning portions 10 of the wafer probing system 1. Please also refer to FIG. 3B, which is a sectional schematic view of an implementation step of an embodiment of a method for aligning an inhomogeneous receiver with an anisotropic emitter on a wafer probing system of the present invention. The probe card 3 is as shown in FIG. 3A, that is to rotate the probe card 3 of FIG. 2B along X axis such that the tips of the probes are all downwards. The probe card 3 is connected to the wafer probing system 1 by connecting the plurality of first probe-card positioning portions 30 to the plurality of first system positioning portions 10 of the wafer probing system 1. The wafer probing system 1 further comprises a probe-tip-and-pad aligning machine 6. A semiconductor wafer 60 is loaded on the probe-tip-and-pad aligning machine 6. A reference semiconductor die 61 and a plurality of semiconductor dies 66 are formed on the semiconductor wafer 60. Each of the plurality of semiconductor dies 66 comprises a plurality of pads 64 and an anisotropic emitter 65. The reference semiconductor die 61 comprises a reference pad 63, an anisotropic emitter 62 and a plurality of pads 64. The reference pad 63 is located at a reference-pad-and-anisotropic-emitter relative position corresponding to the anisotropic emitter 62, wherein the relative positions between the tips of the plurality of probes 32 and the reference tip 35 of the reference probe 31 on the probe card 3 are corresponding to the relative positions between the plurality of pads 64 and the reference pad 63 of the reference semiconductor die 61, and also corresponding to the relative positions between the plurality of pads 64 of the semiconductor die 66. By the Step A, the receiver center position of the inhomogeneous receiver 4 on the wafer probing system 1 can be measured and calculated. By the Step B, the reference tip position of the reference tip 35 of the reference probe 31 on the probe card 3 can be measured and calculated. When the probe card 3 has been rotated (180 degree) along the X axis such that the tips of probes are downwards, and the probe card 3 is connected to the wafer probing system 1 (as shown in FIG. 3B), then the position of the reference tip 35 of the reference probe 31 corresponding to the wafer probing system 1 can be calculated. Hence, the relative position between the reference tip 35 of the reference probe 31 and the receiver center position of the inhomogeneous receiver 4 can be calculated by the receiver center position of the inhomogeneous receiver 4 on the wafer probing system 1 and the reference tip position of the reference tip 35 of the reference probe 31 on the probe card 3. Furthermore, when the reference tip 35 of the reference probe 31 and the reference pad 63 are aligned, the relative position between the emitter center of the anisotropic emitter 62 and the receiver center position of the inhomogeneous receiver 4 can be calculated by the reference-pad-and-anisotropic-emitter relative position between the reference pad 63 and the emitter center of the anisotropic emitter 62.

Therefore, it can be achieved that to displace the inhomogeneous receiver 4 in an aligning displacement such that when the reference tip 35 of the reference probe 31 and the reference pad 63 are aligned, the relative position between the emitter center of the anisotropic emitter 62 and the receiver center position of the inhomogeneous receiver 4 is equal to zero, thereby the precise alignment of the emitter center of the anisotropic emitter 62 with the receiver center position of the inhomogeneous receiver 4 is achieved. Hence, in the Step C, according to the reference-pad-and-anisotropic-emitter relative position between the reference pad 63 and the emitter center of the anisotropic emitter 62, the reference tip position of the reference tip 35 of the reference probe 31 on the probe card 3 and the receiver center position of the inhomogeneous receiver 4 on the wafer probing system 1, the relative position between the emitter center of the anisotropic emitter 62 and the receiver center position of the inhomogeneous receiver 4 is calculated and the inhomogeneous receiver 4 is displaced in an aligning displacement such that after the Step D is executed (aligning the reference tip 35 of the reference probe 31 with the reference pad 63 by a probe-tip-and-pad aligning machine 6 of the wafer probing system 1), the relative position between the emitter center of the anisotropic emitter 62 and the receiver center position of the inhomogeneous receiver 4 is equal to zero, thereby the precise alignment of the emitter center of the anisotropic emitter 62 with the receiver center position of the inhomogeneous receiver 4 is achieved, wherein the aligning displacement is related to the reference-pad-and-anisotropic-emitter relative position, the reference tip position and the receiver center position. In some embodiments, the anisotropic emitter 62 and the anisotropic emitter 65 are selected from the group consisting of: a patch antenna and a slot antenna. In some other embodiments, the anisotropic emitter 62 and the anisotropic emitter 65 are selected from the group consisting of: a light emitting diode and a laser diode.

In some embodiments, the steps of the method for aligning an inhomogeneous receiver with an anisotropic emitter on a wafer probing system of the present invention are in following sequences of: the Step C and the Step D. In some other embodiments, the steps of the method for aligning an inhomogeneous receiver with an anisotropic emitter on a wafer probing system of the present invention are in following sequences of: the Step D and the Step C.

Figure 3C:
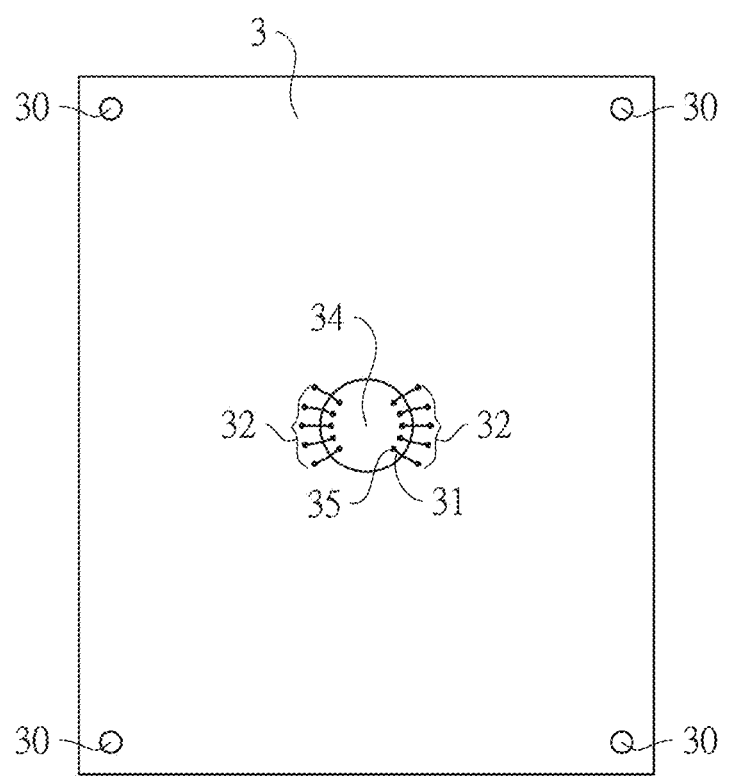
FIG. 3C is a schematic view of the probe card of FIG. 2B rotated along the Y axis (tips of the probes are downwards).

Please refer to FIG. 3C, which is a schematic view of the probe card of FIG. 2B rotated along the Y axis (tips of the probes are downwards). In current embodiment, when the probe card 3 has been rotated (180 degree) along the Y axis such that the tip of each of the plurality of probes 32 and the reference tip 35 of the reference probe 31 are downwards, the plurality of first probe-card positioning portions 30 of the probe card 3 may be connected to the plurality of first system positioning portions 10 of the wafer probing system 1. By the Step B, the reference tip position of the reference tip 35 of the reference probe 31 on the probe card 3 can be measured and calculated. When the probe card 3 has been rotated (180 degree) along the Y axis such that the tips of probes are downwards, and the probe card 3 is connected to the wafer probing system 1, then the position of the reference tip 35 of the reference probe 31 corresponding to the wafer probing system 1 can be calculated.

Figure 4A:
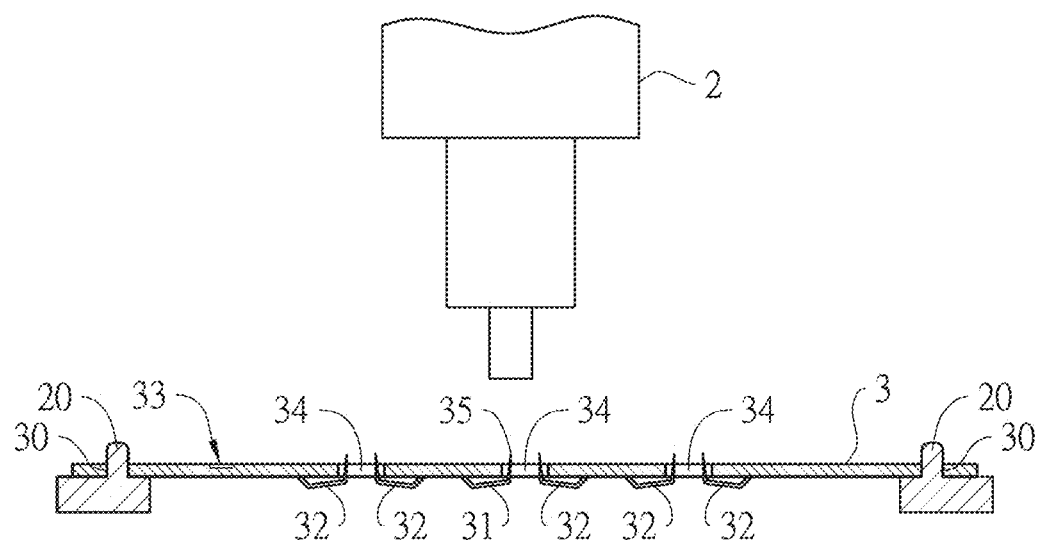
FIG. 4A is a sectional schematic view of an implementation step of an embodiment of a method for aligning an inhomogeneous receiver with an anisotropic emitter on a wafer probing system of the present invention.

Please refer to FIG. 4A, which is a sectional schematic view of an implementation step of an embodiment of a method for aligning an inhomogeneous receiver with an anisotropic emitter on a wafer probing system of the present invention. Please also refer to FIG. 4B, which is a top schematic view of a probe card (tips of the probes are upwards) of an embodiment of a method for aligning an inhomogeneous receiver with an anisotropic emitter on a wafer probing system of the present invention. FIG. 4A presents another embodiment of Step B. In current embodiment, a probe card 3 comprises a plurality of first probe-card positioning portions 30, a plurality of probe sets 36, a reference probe set 37 and a probe card reference point 33. Each of the plurality of probe sets 36 comprises a through hole 34 and a plurality of probes 32. The reference probe set 37 comprises a through hole 34, a reference probe 31 and a plurality of probes 32. The relative positions between the reference probe set 37 and each of the plurality of probe sets 36 are corresponding to the distribution of the semiconductor dies under test (please refer to the embodiment of FIG. 4D later). Furthermore, the relative positions between a tip of each of the plurality of probes 32 and a reference tip 35 of the reference probe 31 of the reference probe set 37, and the relative positions between a tip of each of the plurality of probes 32 of each of the plurality of probe sets 36 are corresponding to the distribution of pads of each of the semiconductor dies under test and fixed by adhesion. The relative positions between the plurality of first probe-card positioning portions 30 and the probe card reference point 33 of the probe card 3 are determined during manufacturing the probe card 3. However, the positions of the reference tip 35 of the reference probe 31 and the tip of each of the plurality of probes 32 of the reference probe set 37 on the probe card 3 needs to be measured by a measuring instrument 2 after the plurality of probes 32 and the reference probe 31 are fixed on the probe card 3 by adhesion. The measuring instrument 2 comprises a plurality of measuring-instrument positioning portions 20. The probe card 3 is connected to the measuring instrument 2 by connecting the plurality of first probe-card positioning portions 30 to the plurality of measuring-instrument positioning portions 20 of the measuring instrument 2, and such that a tip of each of the plurality of probes 32 and the reference tip 35 of the reference probe 31 of the reference probe set 37 and a tip of each of the plurality of probes 32 of each of the plurality of probe sets 36 are upwards. In the step B, a reference tip position of the reference tip 35 of the reference probe 31 of the reference probe set 37 on the probe card 3 is measured by the measuring instrument 2. By measuring the relative position between the reference tip 35 of the reference probe 31 of the reference probe set 37 on the probe card 3 and the probe card reference point 33 of the probe card 3, the reference tip position of the reference tip 35 of the reference probe 31 on the probe card 3 can be calculated. Before executing measuring the reference tip position of the reference tip 35 of the reference probe 31 of the reference probe set 37 on the probe card 3, the Step B may further comprises following step of: connecting the plurality of first probe-card positioning portions 30 of the probe card 3 to the plurality of measuring-instrument positioning portions 20 of the measuring instrument 2 such that the probe card 3 is connected to the measuring instrument 2. After executing measuring the reference tip position of the reference tip 35 of the reference probe 31 of the reference probe set 37 on the probe card 3, the Step B may further comprises following step of: separating the connection of the plurality of first probe-card positioning portions 30 of the probe card 3 and the plurality of measuring-instrument positioning portions 20 of the measuring instrument 2, and moving away the probe card 3. In current embodiment, the measuring instrument 2 is selected from the group consisting of: a microscope and a ruler. In some embodiments, there is no such a probe card reference point 33 on the probe card 3; wherein in the Step B, the reference tip position of the reference tip 35 of the reference probe 31 of the reference probe set 37 on the probe card 3 can be calculated by measuring the relative position between the reference tip 35 of the reference probe 31 of the reference probe set 37 on the probe card 3 and any one of the plurality of first probe-card positioning portions 30 of the probe card 3. In some other embodiments, there is no such a probe card reference point 33 on the probe card 3; wherein in the Step B, the reference tip position of the reference tip 35 of the reference probe 31 of the reference probe set 37 on the probe card 3 can be calculated by measuring the relative position between the reference tip 35 of the reference probe 31 of the reference probe set 37 on the probe card 3 and any one of the plurality of measuring-instrument positioning portions 20 of the measuring instrument 2. Please refer to FIG. 4C, which is a schematic view of the probe card of FIG. 4B rotated along the X axis (tips of the probes are downwards). In current embodiment, when the probe card 3 has been rotated (180 degree) along the X axis such that the tip of each of the plurality of probes 32 and the reference tip 35 of the reference probe 31 of the reference probe set 37 and the tip of each of the plurality of probes 32 of each of the plurality of probe sets 36 are downwards, the plurality of first probe-card positioning portions 30 of the probe card 3 may be connected to the plurality of first system positioning portions 10 of the wafer probing system 1. Please also refer to FIG. 4D, which is a sectional schematic view of an implementation step of an embodiment of a method for aligning an inhomogeneous receiver with an anisotropic emitter on a wafer probing system of the present invention. The probe card 3 is as shown in FIG. 4C, that is to rotate the probe card 3 of FIG. 4B along X axis such that the tips of the probes are all downwards. The probe card 3 is connected to the wafer probing system 1 by connecting the plurality of first probe-card positioning portions 30 to the plurality of first system positioning portions 10 of the wafer probing system 1. The wafer probing system 1 further comprises a probe-tip-and-pad aligning machine 6. A semiconductor wafer 60 is loaded on the probe-tip-and-pad aligning machine 6. A reference semiconductor die 61 and a plurality of adjacent semiconductor dies 67 are formed on the semiconductor wafer 60 within a testing area 68. Each of the plurality of adjacent semiconductor dies 67 comprises a plurality of pads 64 and an adjacent anisotropic emitter 69. The reference semiconductor die 61 comprises a reference pad 63, an anisotropic emitter 62 and a plurality of pads 64. The reference pad 63 is located at a reference pad testing position within the testing area 68. The relative positions between the reference probe 31 and the plurality of probes 32 of the reference probe set 37 of the probe card 3 are corresponding to the relative positions between the reference pad 63 and the plurality of pads 64 of the reference semiconductor die 61, and also corresponding to the relative positions between the plurality of pads 64 of any one of the plurality of adjacent semiconductor dies 67; similarly, the relative positions between the plurality of probes 32 of any of the plurality of probe sets 36 are corresponding to the relative positions between the plurality of pads 64 of any one of the plurality of adjacent semiconductor dies 67, and also corresponding to the relative positions between the reference pad 63 and the plurality of pads 64 of the reference semiconductor die 61. By the Step A, the receiver center position of the inhomogeneous receiver 4 on the wafer probing system 1 can be measured and calculated. By the Step B, the reference tip position of the reference tip 35 of the reference probe 31 of the reference probe set 37 on the probe card 3 can be measured and calculated. When the probe card 3 has been rotated (180 degree) along the X axis such that the tips of probes are downwards, and the probe card 3 is connected to the wafer probing system 1 (as shown in FIG. 4D), then the position of the reference tip 35 of the reference probe 31 of the reference probe set 37 corresponding to the wafer probing system 1 can be calculated. Hence, the relative position between the reference tip 35 of the reference probe 31 and the receiver center position of the inhomogeneous receiver 4 can be calculated by the receiver center position of the inhomogeneous receiver 4 on the wafer probing system 1 and the reference tip position of the reference tip 35 of the reference probe 31 on the probe card 3. Furthermore, since the reference pad 63 is located at a reference pad testing position within the testing area 68, an aligning displacement can be calculated such that after displacing the inhomogeneous receiver 4 in the aligning displacement and when the reference tip 35 of the reference probe 31 and the reference pad 63 are aligned, a measuring range of the receiver input 40 of the inhomogeneous receiver 4 covers the anisotropic emitter 62 of the reference semiconductor die 61 and an adjacent anisotropic emitter 69 of each of the plurality of adjacent semiconductor dies 67 within the testing area 68. Hence, in the Step C, the aligning displacement is calculated according to the reference pad testing position the reference pad 63 located within the testing area 68, the reference tip position of the reference tip 35 of the reference probe 31 of the reference probe set 37 on the probe card 3 and the receiver center position of the inhomogeneous receiver 4 on the wafer probing system 1, and the inhomogeneous receiver 4 is displaced in the aligning displacement such that after the Step D is executed (aligning the reference tip 35 of the reference probe 31 with the reference pad 63 by a probe-tip-and-pad aligning machine 6 of the wafer probing system 1), the measuring range of the receiver input 40 of the inhomogeneous receiver 4 covers the anisotropic emitter 62 of the reference semiconductor die 61 and the adjacent anisotropic emitter 69 of each of the plurality of adjacent semiconductor dies 67 within the testing area 68. In some embodiments, the anisotropic emitter 62 and the adjacent anisotropic emitter 69 are selected from the group consisting of: a patch antenna, a slot antenna, a light emitting diode and a laser diode, wherein the inhomogeneous receiver 4 is selected from the group consisting of: an integrating sphere, an optical filter, a lens, a horn antenna, an electromagnetic waveguide, a photosensitive device and a light collection device, wherein the photosensitive device is selected from the group consisting of: a charge coupled device and a complementary metal-oxide-semiconductor device, wherein through performing one alignment procedure of aligning the reference tip 35 of the reference probe 31 with the reference pad 63 by a probe-tip-and-pad aligning machine 6 of the wafer probing system 1, the measuring range of the receiver input 40 of the inhomogeneous receiver 4 can cover the anisotropic emitter 62 of the reference semiconductor die 61 and the adjacent anisotropic emitter 69 of each of the plurality of adjacent semiconductor dies 67 within the testing area 68, thereby the reference semiconductor die 61 and each of the plurality of adjacent semiconductor dies 67 within the testing area 68 are capable of being tested one by one. It is no need to perform one by one alignment procedure for the reference semiconductor die 61 and each of the plurality of adjacent semiconductor dies 67 by the probe-tip-and-pad aligning machine 6 of the wafer probing system 1. Hence it can significantly reduce the number of performing alignment procedures by the probe-tip-and-pad aligning machine 6 of the wafer probing system 1, thereby significantly reducing the wafer probing testing time on machine movement and alignment procedures. In some other embodiments, the anisotropic emitter 62 and the adjacent anisotropic emitter 69 are selected from the group consisting of: a patch antenna, a slot antenna, a light emitting diode and a laser diode, wherein the inhomogeneous receiver 4 is selected from the group consisting of: an integrating sphere, an optical filter, a lens, a horn antenna, an electromagnetic waveguide, a photosensitive device and a light collection device, wherein the photosensitive device is selected from the group consisting of: a charge coupled device and a complementary metal-oxide-semiconductor device, wherein through performing one alignment procedure of aligning the reference tip 35 of the reference probe 31 with the reference pad 63 by a probe-tip-and-pad aligning machine 6 of the wafer probing system 1, the measuring range of the receiver input 40 of the inhomogeneous receiver 4 can cover the anisotropic emitter 62 of the reference semiconductor die 61 and the adjacent anisotropic emitter 69 of each of the plurality of adjacent semiconductor dies 67 within the testing area 68, thereby the reference semiconductor die 61 and each of the plurality of adjacent semiconductor dies 67 within the testing area 68 are capable of being tested at the same time. It is no need to test the reference semiconductor die 61 and each of the plurality of adjacent semiconductor dies 67 one by one. It is no need to perform one by one alignment procedure for reference semiconductor die 61 and each of the plurality of adjacent semiconductor dies 67 by the probe-tip-and-pad aligning machine 6 of the wafer probing system 1. Hence it can significantly reduce the number of performing alignment procedures by the probe-tip-and-pad aligning machine 6 of the wafer probing system 1. Furthermore, the anisotropic emitter 62 of the reference semiconductor die 61 and the adjacent anisotropic emitter 69 of each of the plurality of adjacent semiconductor dies 67 within the testing area 68 can be test (wafer probing testing) at the same time. Thereby it can significantly reduce the time on machine movement and alignment procedures, and also significantly reduce the time on wafer probing testing. In some embodiments, the steps of the method for aligning an inhomogeneous receiver with an anisotropic emitter on a wafer probing system of the present invention are in following sequences of: the Step A and the Step B. In some other embodiments, the steps of the method for aligning an inhomogeneous receiver with an anisotropic emitter on a wafer probing system of the present invention are in following sequences of: the Step B and the Step A. In some embodiments, the steps of the method for aligning an inhomogeneous receiver with an anisotropic emitter on a wafer probing system of the present invention are in following sequences of: the Step C and the Step D. In some other embodiments, the steps of the method for aligning an inhomogeneous receiver with an anisotropic emitter on a wafer probing system of the present invention are in following sequences of: the Step D and the Step C.

Figure 4B:
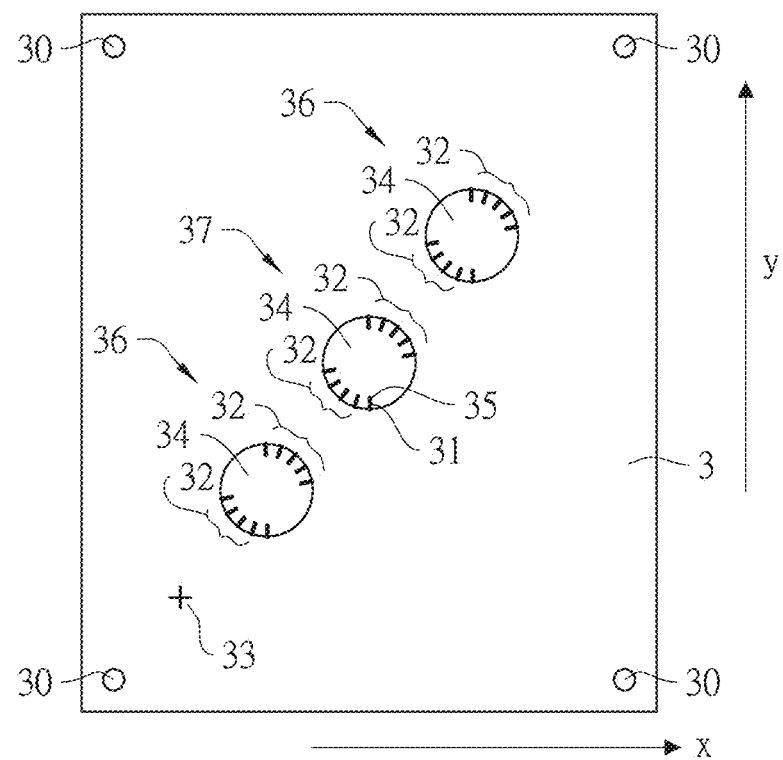
FIG. 4B is a top schematic view of a probe card (tips of the probes are upwards) of an embodiment of a method for aligning an inhomogeneous receiver with an anisotropic emitter on a wafer probing system of the present invention.
Figure 4C:
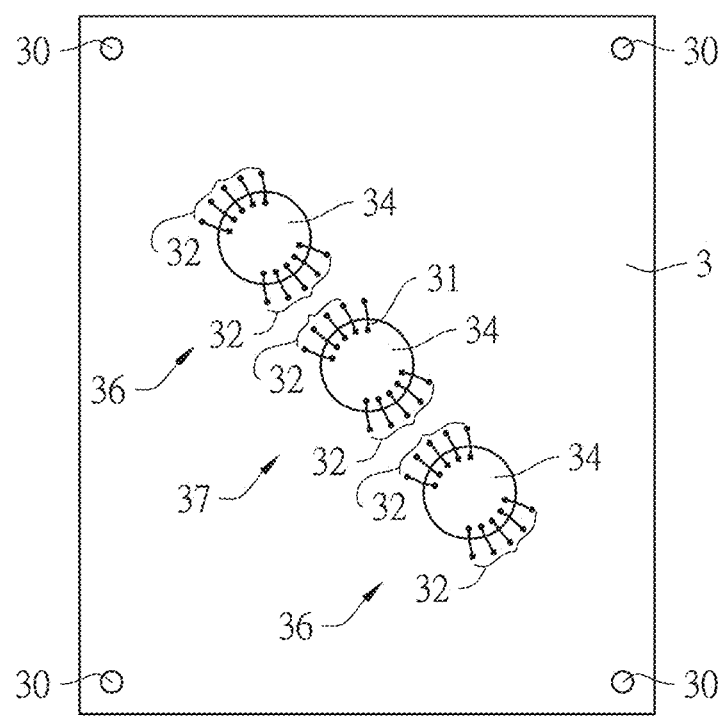
FIG. 4C is a schematic view of the probe card of FIG. 4B rotated along the X axis (tips of the probes are downwards).
Figure 4D:
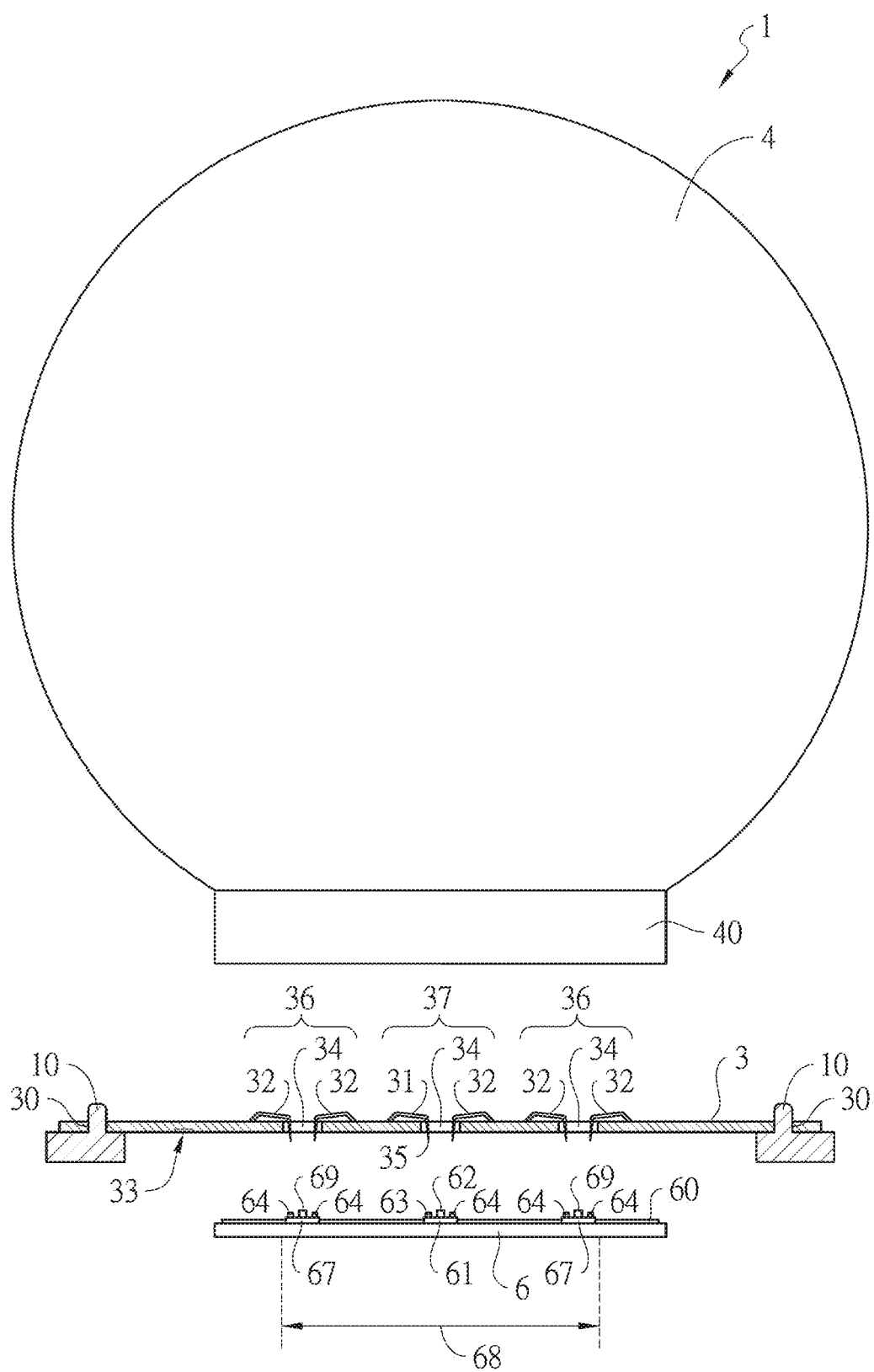
FIG. 4D is a sectional schematic view of an implementation step of an embodiment of a method for aligning an inhomogeneous receiver with an anisotropic emitter on a wafer probing system of the present invention.
Figure 4E:
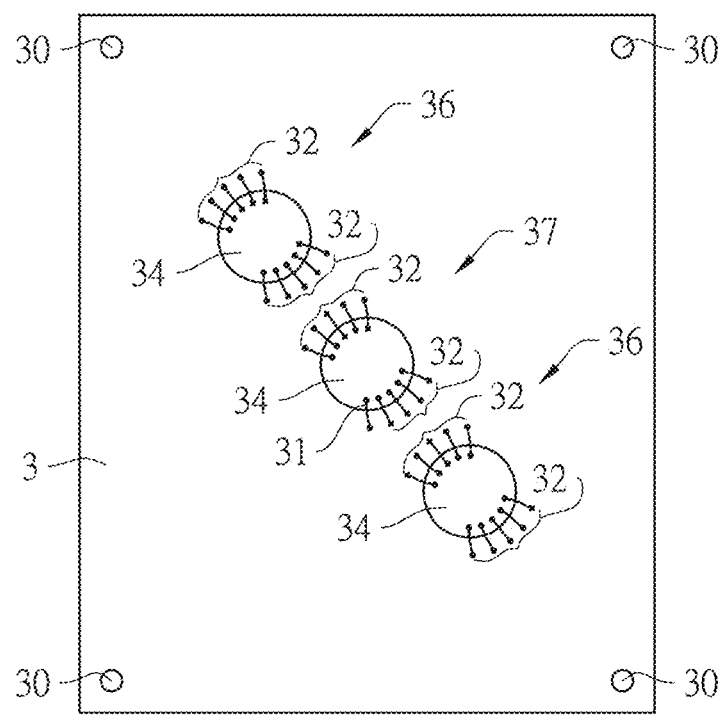
FIG. 4E is a schematic view of the probe card of FIG. 4B rotated along the Y axis (tips of the probes are downwards).

Please refer to FIG. 4E, which is a schematic view of the probe card of FIG. 4B rotated along the Y axis (tips of the probes are downwards). In current embodiment, when the probe card 3 has been rotated (180 degree) along the Y axis such that the tip of each of the plurality of probes 32 and the reference tip 35 of the reference probe 31 of the reference probe set 37 and the tip of each of the plurality of probes 32 of each of the plurality of probe sets 36 are downwards, the plurality of first probe-card positioning portions 30 of the probe card 3 may be connected to the plurality of first system positioning portions 10 of the wafer probing system 1. By the Step B, the reference tip position of the reference tip 35 of the reference probe 31 of the reference probe set 37 on the probe card 3 can be measured and calculated. When the probe card 3 has been rotated (180 degree) along the Y axis such that the tips of probes are downwards, and the probe card 3 is connected to the wafer probing system 1, then the position of the reference tip 35 of the reference probe 31 of the reference probe set 37 corresponding to the wafer probing system 1 can be calculated.

Figure 5:
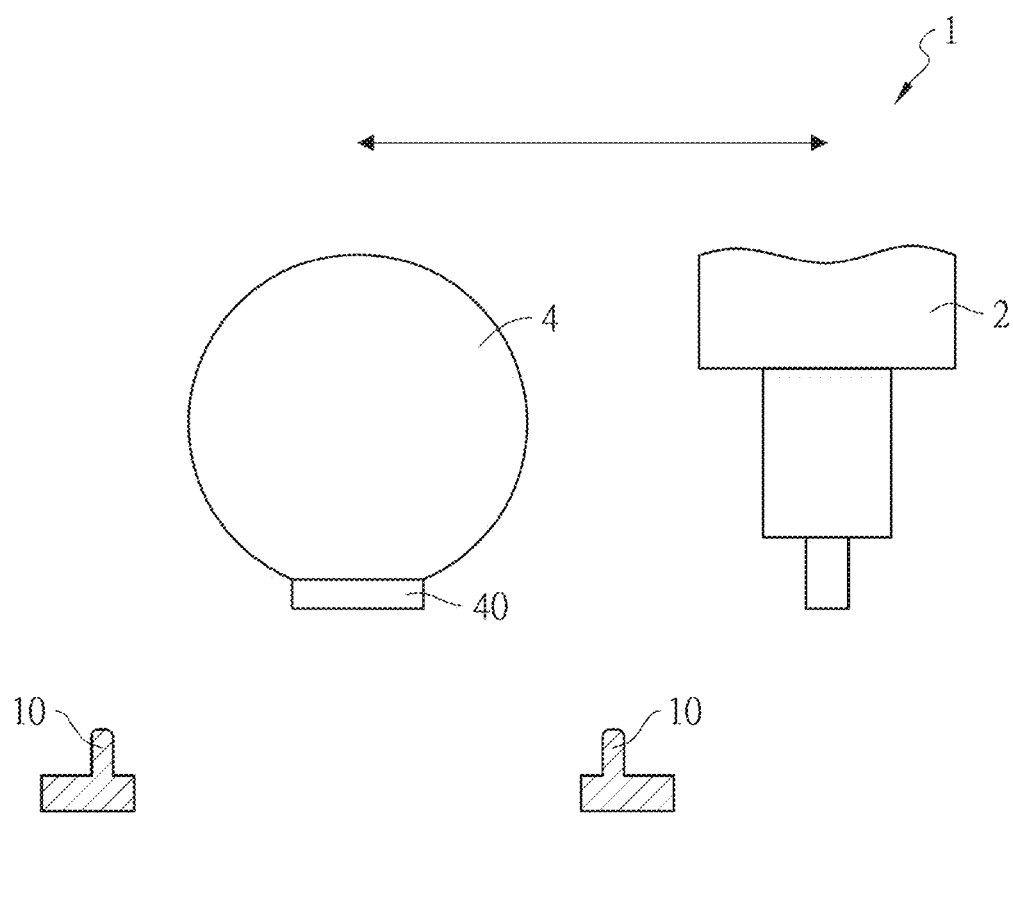
FIG. 5 is a sectional schematic view of an embodiment of a method for aligning an inhomogeneous receiver with an anisotropic emitter on a wafer probing system of the present invention.

Please refer to FIG. 5, which is a sectional schematic view of an embodiment of a method for aligning an inhomogeneous receiver with an anisotropic emitter on a wafer probing system of the present invention. In current embodiment, the measuring instrument 2 is configured on the wafer probing system 1. However, in current embodiment, the measuring instrument 2 does not have such a measuring-instrument positioning portions 20. Therefore, before executing measuring the reference tip position of the reference tip 35 of the reference probe 31 on the probe card 3, the Step B may further comprises following step of: connecting the plurality of first probe-card positioning portions 30 of the probe card 3 to the plurality of first system positioning portions 10 of the wafer probing system 1 such that the probe card 3 is connected to the wafer probing system 1. After executing measuring the reference tip position of the reference tip 35 of the reference probe 31 on the probe card 3, the Step B may further comprises following step of: separating the connection of the plurality of first probe-card positioning portions 30 of the probe card 3 and the plurality of first system positioning portions 10 of the wafer probing system 1, and moving away the probe card 3.

Figure 6A:
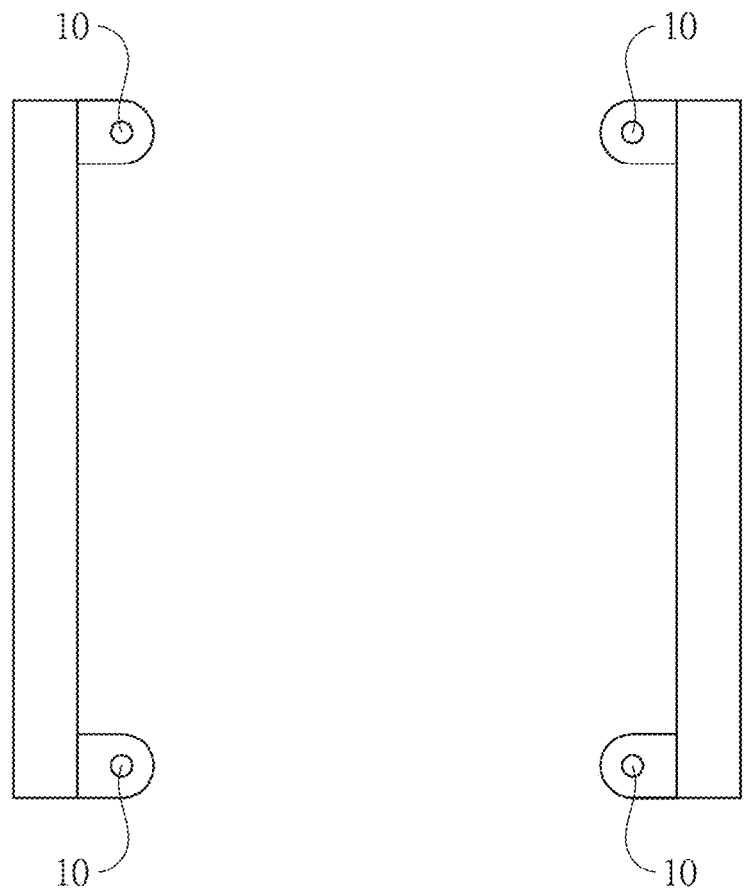
FIG. 6A is a top schematic view of system positioning portions of an embodiment of a method for aligning an inhomogeneous receiver with an anisotropic emitter on a wafer probing system of the present invention.
Figure 6B:
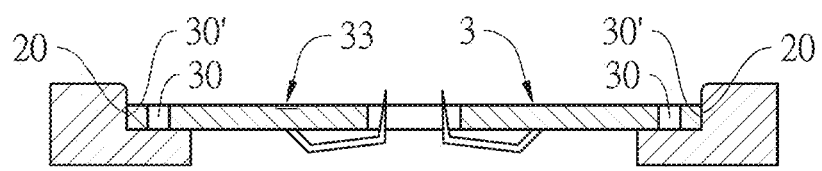
FIG. 6B is a sectional schematic view of the connection of the probe card and the measurement instrument of an embodiment of a method for aligning an inhomogeneous receiver with an anisotropic emitter on a wafer probing system of the present invention.

Please refer to FIG. 6A, which is a top schematic view of system positioning portions of an embodiment of a method for aligning an inhomogeneous receiver with an anisotropic emitter on a wafer probing system of the present invention. Please also refer to FIG. 6B, which is a sectional schematic view of the connection of the probe card and the measurement instrument of an embodiment of a method for aligning an inhomogeneous receiver with an anisotropic emitter on a wafer probing system of the present invention. In the embodiments of FIGS. 6A and 6B, the probe card 3 comprises a plurality of first probe-card positioning portions 30 and a plurality of second probe-card positioning portions 30', wherein the plurality of first probe-card positioning portions 30 of the probe card 3 are capable of being connected to the plurality of first system positioning portions 10 of the wafer probing system 1 such that the probe card 3 is connected to the wafer probing system 1 (the Step D); while the plurality of second probe-card positioning portions 30' of the probe card 3 are capable of being connected to the plurality of measuring-instrument positioning portions 20 of the measuring instrument 2 such that the probe card 3 is connected to the measuring instrument 2 (the Step B).

Figure 7:
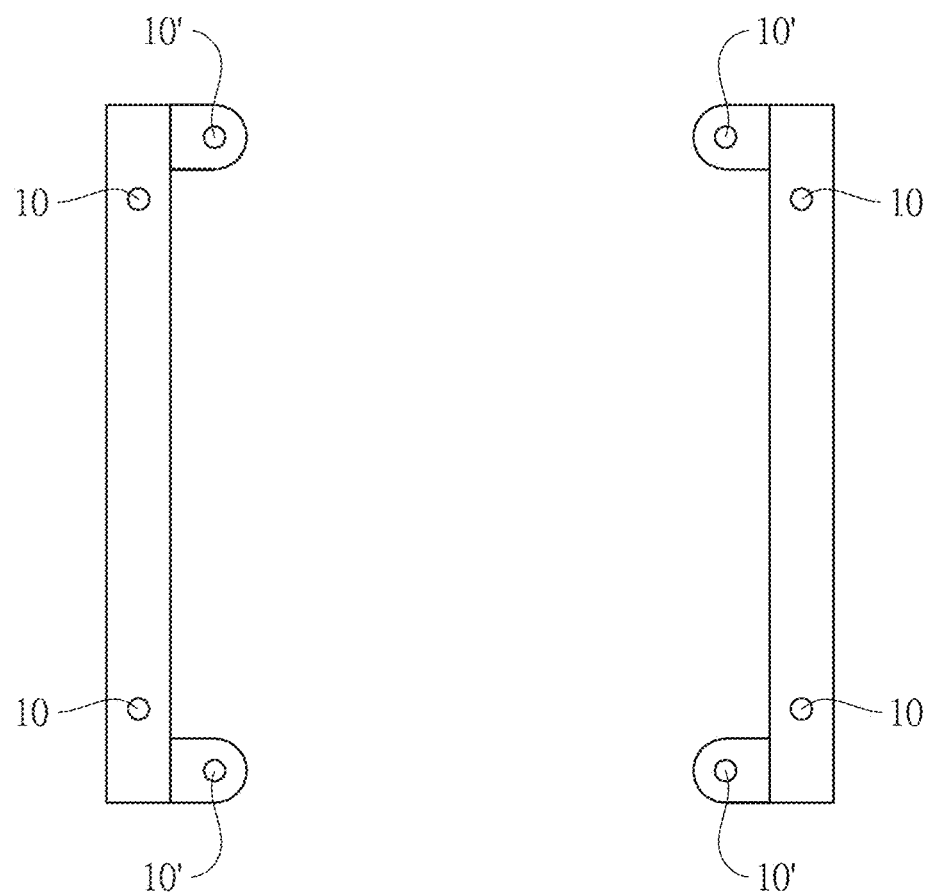
FIG. 7 is a top schematic view of system positioning portions of an embodiment of a method for aligning an inhomogeneous receiver with an anisotropic emitter on a wafer probing system of the present invention.
Figure 8:
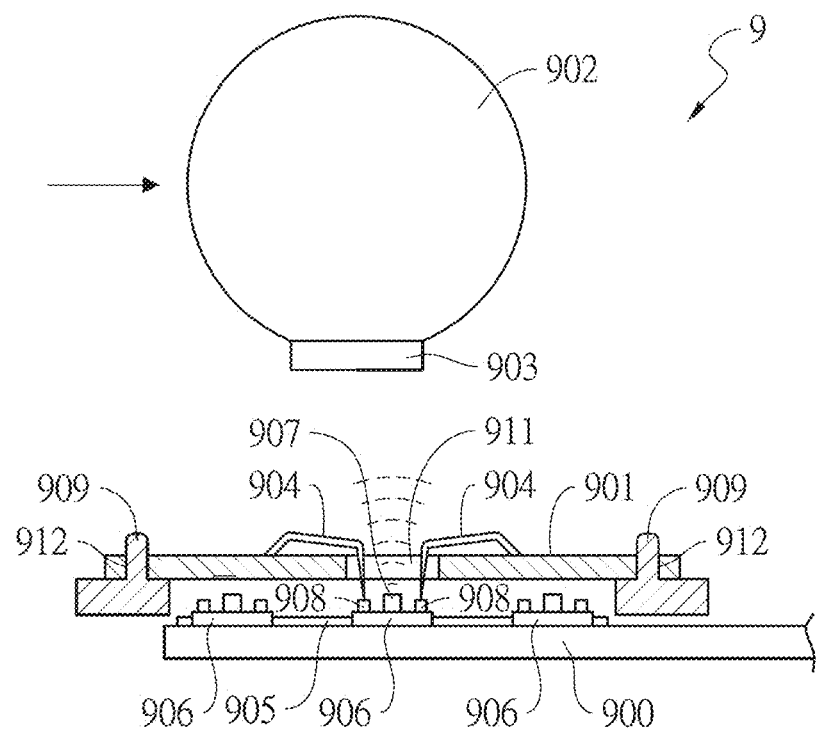
FIG. 8 is a sectional schematic view of an implementation step of an embodiment of a method for aligning receiver with emitter on wafer probing system of conventional technology.
Figure 9:
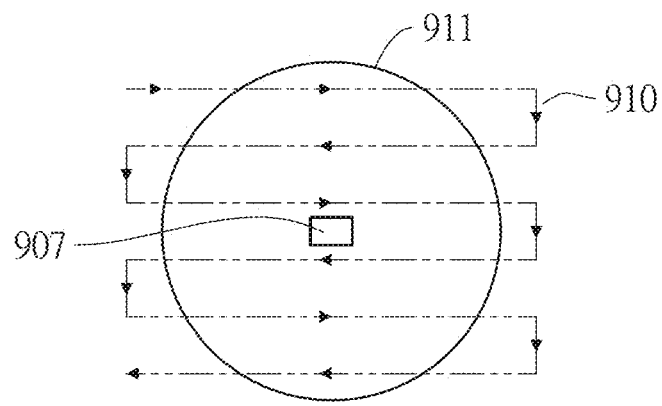
FIG. 9 is a top schematic view of an integrating sphere searching trajectory of an embodiment of a method for aligning receiver with emitter on wafer probing system of conventional technology.

Please refer to FIG. 7, which is a top schematic view of system positioning portions of an embodiment of a method for aligning an inhomogeneous receiver with an anisotropic emitter on a wafer probing system of the present invention. In current embodiment, the wafer probing system 1 comprises a plurality of first system positioning portions 10 and a plurality of second system positioning portions 10', wherein the plurality of first system positioning portions 10 of the wafer probing system 1 are capable of being connected to the plurality of sensor-board positioning portions 50 of the sensor board 5 such that the sensor board 5 is connected to the wafer probing system 1 (the Step A); while the plurality of second system positioning portions 10' of the wafer probing system 1 are capable of being connected to the plurality of first probe-card positioning portions 30 of the probe card 3 such that the probe card 3 is connected to the wafer probing system 1 (the Step D).

As disclosed in the above description and attached drawings, the present invention can provide a method for aligning an inhomogeneous receiver with an anisotropic emitter on a wafer probing system. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A method for aligning an inhomogeneous receiver with an anisotropic emitter on a wafer probing system, wherein a reference semiconductor die is formed on a semiconductor wafer, wherein said reference semiconductor die comprises a reference pad and the anisotropic emitter, wherein said reference pad is located at a reference-pad-and-anisotropic-emitter relative position corresponding to said anisotropic emitter, wherein said method comprises following steps of:
   Step A: measuring a receiver center position of the inhomogeneous receiver by a profile sensor, wherein said inhomogeneous receiver is configured on the wafer probing system;
   Step B: measuring a reference tip position of a reference tip of a reference probe on a probe card by a measuring instrument;
   Step C: displacing said inhomogeneous receiver in an aligning displacement according to said reference-pad-and-anisotropic-emitter relative position, said reference tip position and said receiver center position; and
   Step D: aligning said reference tip of said reference probe with said reference pad by a probe-tip-and-pad aligning machine of said wafer probing system.

2. The method for aligning the inhomogeneous receiver with the anisotropic emitter on the wafer probing system according to claim 1, wherein said Step A comprises following steps of:
   Step A10: sensing a first contour of said inhomogeneous receiver along a first sensing direction by said profile sensor;
   Step A20: sensing a second contour of said inhomogeneous receiver along a second sensing direction by said profile sensor, wherein said second sensing direction is at an angle to said first sensing direction, wherein said angle is greater than 0 degree and less than 180 degrees; and
   Step A30: calculating said receiver center position of said inhomogeneous receiver by said first contour of said inhomogeneous receiver and said second contour of said inhomogeneous receiver.

3. The method for aligning the inhomogeneous receiver with the anisotropic emitter on the wafer probing system according to claim 2, wherein said angle is equal to 90 degrees.

4. The method for aligning the inhomogeneous receiver with the anisotropic emitter on the wafer probing system according to claim 1, wherein said profile sensor is configured on a sensor board, wherein said sensor board has at least one sensor-board positioning portion, wherein said wafer probing system has at least one first system positioning portion, wherein said at least one sensor-board positioning portion is capable of being connected to said at least one first system positioning portion.

5. The method for aligning the inhomogeneous receiver with the anisotropic emitter on the wafer probing system according to claim 4, wherein said Step A comprises following steps of:
Step A10: configuring said profile sensor on said sensor board such that said profile sensor senses a first contour of said inhomogeneous receiver along a first sensing direction;
Step A20: configuring said profile sensor on said sensor board such that said profile sensor senses a second contour of said inhomogeneous receiver along a second sensing direction, wherein said second sensing direction is at an angle to said first sensing direction, wherein said angle is greater than 0 degree and less than 180 degrees; and
Step A30: calculating said receiver center position of said inhomogeneous receiver by said first contour of said inhomogeneous receiver and said second contour of said inhomogeneous receiver.

6. The method for aligning the inhomogeneous receiver with the anisotropic emitter on the wafer probing system according to claim 5, wherein said angle is equal to 90 degrees.

7. The method for aligning the inhomogeneous receiver with the anisotropic emitter on the wafer probing system according to claim 4, wherein said probe card has at least one first probe-card positioning portion, wherein said at least one first probe-card positioning portion is capable of being connected to said at least one first system positioning portion.

8. The method for aligning the inhomogeneous receiver with the anisotropic emitter on the wafer probing system according to claim 7, wherein said measuring instrument has at least one measuring-instrument positioning portion, wherein said at least one first probe-card positioning portion is capable of being connected to said at least one measuring-instrument positioning portion.

9. The method for aligning the inhomogeneous receiver with the anisotropic emitter on the wafer probing system according to claim 7, wherein said probe card has at least one second probe-card positioning portion, wherein said measuring instrument has at least one measuring-instrument positioning portion, wherein said at least one second probe-card positioning portion is capable of being connected to said at least one measuring-instrument positioning portion.

10. The method for aligning the inhomogeneous receiver with the anisotropic emitter on the wafer probing system according to claim 4, wherein said wafer probing system has at least one second system positioning portion, wherein said probe card has at least one first probe-card positioning portion, wherein said at least one first probe-card positioning portion is capable of being connected to said at least one second system positioning portion.

11. The method for aligning the inhomogeneous receiver with the anisotropic emitter on the wafer probing system according to claim 10, wherein said measuring instrument has at least one measuring-instrument positioning portion, wherein said at least one first probe-card positioning portion is capable of being connected to said at least one measuring-instrument positioning portion.

12. The method for aligning the inhomogeneous receiver with the anisotropic emitter on the wafer probing system according to claim 10, wherein said probe card has at least one second probe-card positioning portion, wherein said measuring instrument has at least one measuring-instrument positioning portion, wherein said at least one second probe-card positioning portion is capable of being connected to said at least one measuring-instrument positioning portion.

13. The method for aligning the inhomogeneous receiver with the anisotropic emitter on the wafer probing system according to claim 1, wherein said measuring instrument is configured on said wafer probing system.

14. The method for aligning the inhomogeneous receiver with the anisotropic emitter on the wafer probing system according to claim 1, wherein the steps of said method are in following sequences of: (1) said Step A, said Step B, said Step C and said Step D; (2) said Step B, said Step A, said Step C and said Step D; (3) said Step A, said Step B, said Step D and said Step C; and (4) said Step B, said Step A, said Step D and said Step C.

15. The method for aligning the inhomogeneous receiver with the anisotropic emitter on the wafer probing system according to claim 1, wherein in said Step B, said reference tip of said reference probe is upwards.

16. The method for aligning the inhomogeneous receiver with the anisotropic emitter on the wafer probing system according to claim 1, wherein in said Step D, said reference tip of said reference probe is downwards.

17. The method for aligning the inhomogeneous receiver with the anisotropic emitter on the wafer probing system according to claim 1, wherein said measuring instrument is selected from the group consisting of: a microscope and a ruler.

18. The method for aligning the inhomogeneous receiver with the anisotropic emitter on the wafer probing system according to claim 1, wherein said profile sensor is a two dimensional laser profile sensor.

19. The method for aligning the inhomogeneous receiver with the anisotropic emitter on the wafer probing system according to claim 1, wherein said inhomogeneous receiver is selected from the group consisting of: a photosensitive device and a light collection device.

20. The method for aligning the inhomogeneous receiver with the anisotropic emitter on the wafer probing system according to claim 19, wherein said photosensitive device is selected from the group consisting of: a charge coupled device and a complementary metal-oxide-semiconductor device.

21. The method for aligning the inhomogeneous receiver with the anisotropic emitter on the wafer probing system according to claim 1, wherein said anisotropic emitter is selected from the group consisting of: a light emitting diode and a laser diode.

22. The method for aligning the inhomogeneous receiver with the anisotropic emitter on the wafer probing system according to claim 1, wherein said inhomogeneous receiver is selected from the group consisting of: an integrating sphere, an optical filter, a lens, a horn antenna and an electromagnetic waveguide.

23. The method for aligning the inhomogeneous receiver with the anisotropic emitter on the wafer probing system according to claim 1, wherein said anisotropic emitter is selected from the group consisting of: a patch antenna and a slot antenna.

24. The method for aligning the inhomogeneous receiver with the anisotropic emitter on the wafer probing system according to claim 1, wherein said reference semiconductor die and a plurality of adjacent semiconductor dies are formed on said semiconductor wafer within a testing area, wherein said reference pad is located at a reference pad testing position within said testing area; wherein in said Step C, said inhomogeneous receiver is displaced in said aligning displacement according to said reference pad testing position, said reference tip position and said receiver center position such that a measuring range of said inhomogeneous receiver covers said anisotropic emitter of said reference semiconductor die and an adjacent anisotropic emitter of each of said plurality of adjacent semiconductor dies within said testing area after said Step A, said Step B, said Step C and said Step D of said method are executed, thereby the wafer probing testing time is significantly reduced.

25. The method for aligning the inhomogeneous receiver with the anisotropic emitter on the wafer probing system according to claim 24, wherein said anisotropic emitter of said reference semiconductor die and an adjacent anisotropic emitter of each of said plurality of adjacent semiconductor dies within said testing area are capable of being tested at the same time.

* * * * *